United States Patent
Egger et al.

(10) Patent No.: US 7,111,218 B2
(45) Date of Patent: Sep. 19, 2006

(54) APPARATUS WITH SELF-TEST CIRCUIT

(75) Inventors: Keith D. Egger, Marshalltown, IA (US); J. David Harp, Montgomery, AL (US)

(73) Assignee: Maytag Corporation, Newton, IA (US)

( * ) Notice: Subject to any disclaimer, the term of this patent is extended or adjusted under 35 U.S.C. 154(b) by 270 days.

(21) Appl. No.: 10/915,196

(22) Filed: Aug. 9, 2004

(65) Prior Publication Data

US 2006/0031729 A1    Feb. 9, 2006

(51) Int. Cl.
*G01R 31/28*    (2006.01)

(52) U.S. Cl. .................... 714/733; 324/767

(58) Field of Classification Search ........... 700/79; 324/96, 767, 424; 714/718, 733
See application file for complete search history.

(56) References Cited

U.S. PATENT DOCUMENTS

| | | | |
|---|---|---|---|
| 3,548,301 A | 12/1970 | Zutkis | |
| 4,158,431 A | 6/1979 | van Bavel et al. | |
| 4,479,117 A | 10/1984 | Marquardt | |
| 4,628,443 A * | 12/1986 | Rickard et al. | 700/79 |
| 4,961,051 A | 10/1990 | Tjebben | |
| 5,153,522 A | 10/1992 | Sano | |
| 5,268,635 A * | 12/1993 | Bortolini et al. | 324/96 |
| 5,444,390 A * | 8/1995 | Bartlett et al. | 324/770 |
| 5,748,644 A | 5/1998 | Szabo | |
| 6,087,846 A * | 7/2000 | Alvord et al. | 324/767 |
| 6,188,225 B1 | 2/2001 | Tislaric | |
| 6,192,495 B1 | 2/2001 | Totorica et al. | |
| 6,314,537 B1 * | 11/2001 | Oh | 714/718 |
| 6,754,864 B1 * | 6/2004 | Gangl et al. | 714/733 |
| 6,918,074 B1 * | 7/2005 | Kim et al. | 714/733 |
| 6,980,005 B1 * | 12/2005 | Finlay et al. | 324/424 |
| 2002/0019964 A1 | 2/2002 | Zettler | |

\* cited by examiner

*Primary Examiner*—David Ton
(74) *Attorney, Agent, or Firm*—McKee, Voorhees & Sease, P.L.C.

(57) ABSTRACT

An apparatus is adapted for self-test. The apparatus includes a microcontroller and a number of relay drivers having outputs electrically connected to form a single input for self-test monitoring. The microcontroller is electrically connected to each of the relay drivers and is adapted to energize each of the relay drivers during self-test. The results of the self-test are monitored via a single input line to the microcontroller or by a single input line to a LED.

27 Claims, 4 Drawing Sheets

APPARATUS WITH SELF-TEST CIRCUIT

BACKGROUND OF THE INVENTION

The present invention relates to a self-test circuit. More particularly, but not exclusively, the present invention relates to a self-test circuit for monitoring the output of a plurality of components, such as relay driver outputs using a single input to a monitoring device.

Self-testing is generally viewed as being advantageous, particularly noninvasive self-tests. Self-test circuits allow a device to be tested without requiring specialized testing devices. A self-test circuit allows a device to be tested either during manufacturing, during servicing, or both during manufacturing and servicing. Self-testing also typically allows tests to be performed quickly and inexpensively which are particularly important in the manufacturing context. For example, a single self-test may replace testing a circuit at numerous test points, thereby reducing the time and cost of testing.

Nevertheless, there are problems with implementing self-test circuits. These problems generally relate to the increased complexity and cost of circuits that incorporate self-testing functionality. For example, adding self-testing to a device may require adding a separate microcontroller for the limited purpose of self-testing. This addition adds significant cost to the device. Existing microcontrollers in an apparatus may not be useable for self-testing because there are insufficient available inputs for the microcontroller. In such an instance, one alternative may be to use a different microcontroller with expanded input capabilities, but doing so would also likely increase the cost and complexity of the device. Therefore, there are problems with incorporating self-test circuits into electronically controlled devices.

Thus, it is a primary object, feature or advantage of the present invention to improve upon the state of the art.

It is a further object, feature or advantage of the present invention to provide a self-test circuit suitable for use in various devices, including household appliances.

Another object, feature or advantage of the present invention is to provide a self-test circuit that minimizes additional cost and complexity.

Yet another object, feature or advantage of the present invention is to provide a self-test circuit that requires only a single input to a microcontroller to test multiple components such as relay drivers.

A still further object, feature, or advantage of the present invention is to provide a self-test circuit that is noninvasive.

One or more of these and/or other objects, features, or advantages of the present invention will become apparent from the specification and claims that follow.

SUMMARY OF THE INVENTION

The present invention provides for a self-test circuit. According to one aspect of the present invention, an apparatus adapted for self-test includes a microcontroller configured for self-tests. There are multiple relay driver outputs electrically connected to a voltage dividing circuit. A single microcontroller input of the microcontroller is electrically connected to the voltage dividing circuit. This single microcontroller input is used to monitor operation of the relay drivers during a self-test. The microcontroller is adapted to energize each of the relay driver outputs during a self-test and is also adapted to monitor the single microcontroller input during the self-test to determine if the relay driver outputs operated as expected. Thus, a preexisting microcontroller within a device can be adapted for self-testing using only a single microcontroller input. Where the microcontroller input is connected to a user interface, the user interface can be used in the self-test.

According to another aspect of the present invention, an apparatus is adapted for a noninvasive self-test while only requiring a single microcontroller input. The apparatus includes a microcontroller and a plurality of relay driver outputs. The relay driver outputs are electrically connected to a voltage dividing circuit. A single input of the microcontroller is electrically connected to the voltage dividing circuit. There is also a display electrically connected to the microcontroller. The display has a primary purpose unrelated to the self-test and a secondary purpose of providing feedback from the self-test. The microcontroller is adapted to energize each of the relay driver outputs during the self-test and is also adapted for monitoring the single microcontroller input during the self-test and controlling the display of feedback from the self-test on the display.

According to another aspect of the present invention, an apparatus is adapted for self-test. The apparatus includes a microcontroller and a plurality of relay drivers having outputs electrically connected to form a single input for self-test monitoring. The microcontroller is electrically connected to the relay drivers and is adapted to energize each of the relay drivers during self-test. The single input can be a single microcontroller input. Alternatively, the single input can be a light emitting diode input. Thus, a self-test of multiple components can be performed without adding costly or complex additions to the circuit.

According to another aspect of the present invention, an apparatus is adapted for self-testing. The apparatus includes a microcontroller and multiple relay driver outputs electrically connected to the LED. The microcontroller is adapted for energizing each of the plurality of relay drivers during self-testing with a sufficient delay between energizing each of the relay drivers such that the number of times that the LED is lit is observable. Thus, by observing the number of times the LED is lit, an observer can determine whether or not the relay drivers are functioning as expected.

DETAILED DESCRIPTION OF THE PREFERRED EMBODIMENT

The present invention provides for implementation of a self-test within an apparatus. The apparatus can be a household appliance, such as a laundry dryer, however, the present invention is not limited to any particular type of apparatus or device. The present invention provides for adding a self-test circuit to various types of devices in a manner that does not require great increases in the cost or complexity of the device.

Figure 1:
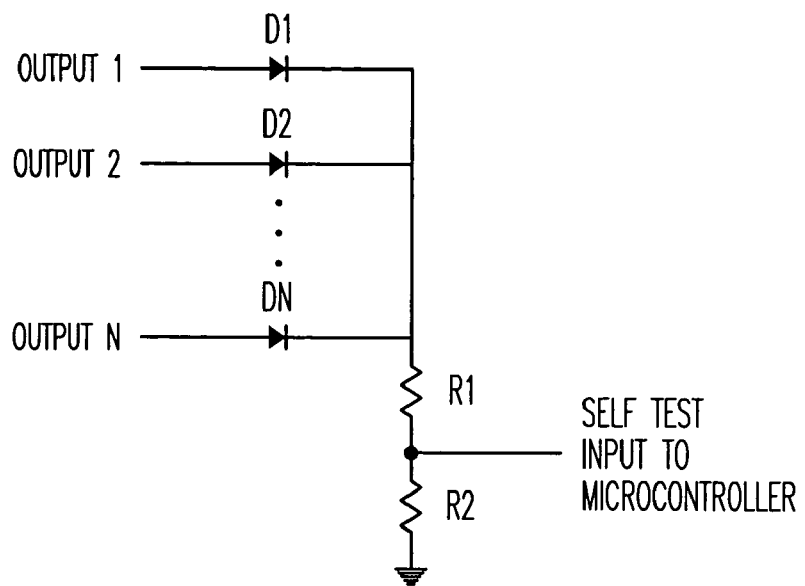
FIG. 1 is an electrical schematic illustrating one embodiment of the present invention where multiple outputs provide a single input to a microcontroller to be used for self-testing.
Figure 2:
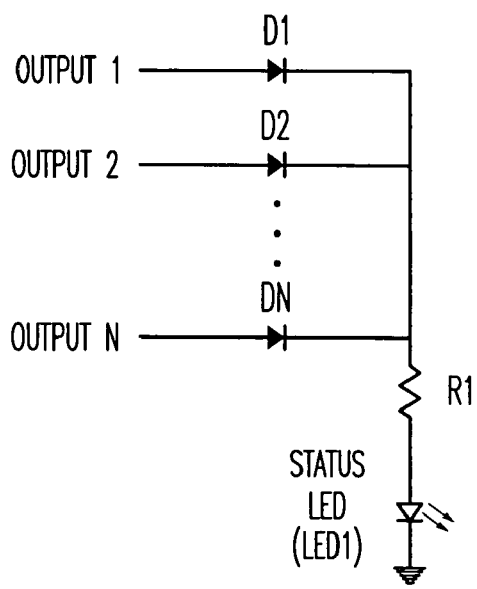
FIG. 2 is an electrical schematic showing multiple outputs being tied to a single input to a status light emitting diode that can be used for the monitoring of a self-test.

FIGS. 1 and 2 provide electrical schematics that help illustrate the elegance and simplicity of the present invention. In FIG. 1, an electrical schematic is shown which provides for a self-test using merely one input to a microcontroller. In FIG. 1, a number of outputs (OUTPUT1, OUTPUT2, . . . OUTPUTN) are shown. These outputs can come from various types of components that are important to the self-test. In an exemplary embodiment, these components are relay drivers, the outputs being relay driver outputs. However, the present invention contemplates that other specific components can also be tested in the same manner. It is noted that self-testing generally involves the testing of an apparatus that includes a control board or a control system and therefore would include components such as relays, or other switching devices to activate a load. However, the specific components involved can vary. There are a number of diodes (D1, D2 . . . DN) illustrated. Each output has an associated diode. The diodes provide electrical isolation so that the outputs can be tied together. The output from each of the diodes (D1, D2, . . . DN) is electrically connected to a voltage dividing circuit comprising resistor R1 and resistor R2. The resistor R2 is electrically connected to ground. A single input to a microcontroller is electrically connected to the voltage dividing circuit between resistor R1 and resistor R2. The microcontroller is programmed to monitor this input during self-test to determine that the relay drivers have performed as expected or have not performed as expected, indicating a problem with one or more of the relay drivers or other problems with the device.

FIG. 2 illustrates another embodiment of the present invention where the output of each diode (D1, D2, . . . DN) is electrically connected to a resistor R1 which in turn is electrically connected to a light emitting diode (LED1). An operator can visually monitor the light emitting diode (LED1) during self-test to determine if the circuit under test performed as expected. The number of times the light emitting diode is lit or the length of time it is lit is monitored.

Figure 3:
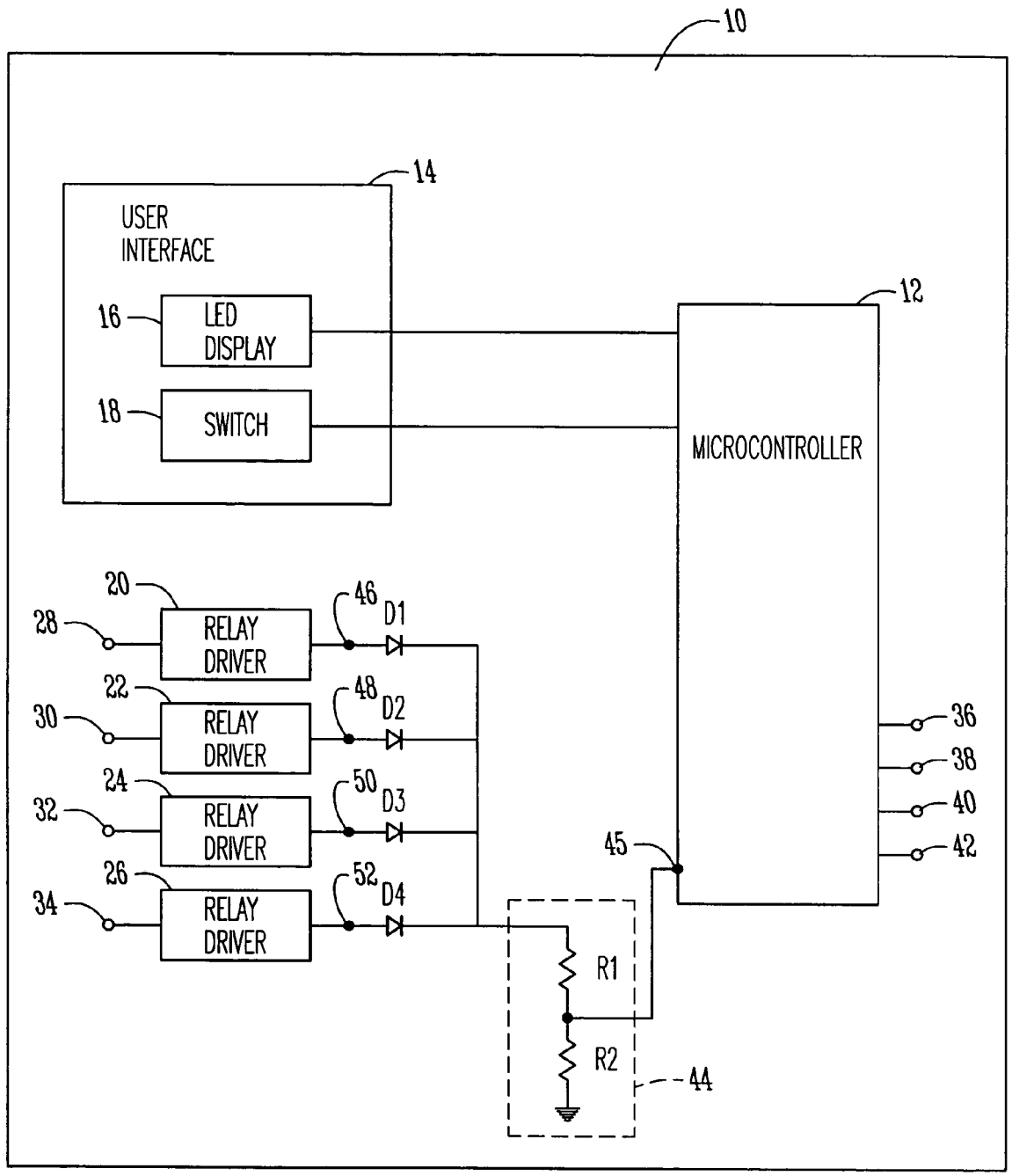
FIG. 3 is a diagram illustrating one embodiment of the present invention where a self-test for multiple relay drivers is implemented using a single input to a microcontroller.

FIG. 3 illustrates the embodiment of FIG. 1 in greater detail. In FIG. 3, an apparatus 10 includes an intelligent control such as a microcontroller 12. The microcontroller 12 is electrically connected to a user interface 14. The present invention contemplates that numerous varieties of a user interface 14 can be used. The user interface 14 shown includes an LED display 16 electrically connected to the microcontroller 12 and a switch 18 electrically connected to the microcontroller 12. The present invention contemplates that other types of a display can be used instead of the LED display 16. Also, although a membrane switch is preferred for switch 18, the present invention contemplates that numerous other types of switches can be part of the user interface 14. A plurality of relay drivers (20, 22, 24, 26) are also shown. As previously explained, the present invention contemplates use with circuits with other types of components being tested besides the relay drivers shown. It should be appreciated, however, that relays are commonly used within numerous types of devices. A microcontroller can provide control of functions of an apparatus by turning components of the device on or off by activating a relay driver which drives a relay (not shown) to turn the various components of the device on or off.

Although four relay drivers are shown, the present invention contemplates any number of relay drivers can be used.

Each relay driver (20, 22, 24, 26) has an associated relay driver input (28, 30, 32, 34). These inputs are preferably controlled by the microcontroller 12. For example, the output 36 from the microcontroller can be electrically connected to the input 28 of the relay driver 20. Similarly, the output 38 of the microcontroller 12 can be electrically connected to the input 30 of the relay driver 22. The output 40 of the microcontroller 12 can be electrically connected to the input 32 of the relay driver 24. The output 42 of the microcontroller 12 can be electrically connected to the input 34 of the relay driver 26. It should be understood that electrical connection does not require direct electrical connection as there may be intervening electrical components between the microcontroller and the relay drivers. Each of the relay drivers (20, 22, 24, 26) has an associated diode (D1, D2, D3, D4) electrically connected to its output (46, 48, 50, 52). Each diode (D1, D2, D3, D4) serves to isolate the relay drivers (20, 22, 24, 26) from each other. Each diode (D1, D2, D3, D4) is electrically connected to a voltage dividing circuit 44 comprising a first resistor R1 and a second resistor R2. An input 45 to the microcontroller 12 is electrically connected between the resistors (R1, R2) of the voltage dividing circuit 44.

The microcontroller 12 is programmed to provide for self-testing. The microcontroller is adapted to energize each of the relay driver outputs (46, 48, 50, 52) during self-test. The microcontroller 12 is adapted for monitoring the single microcontroller input 45 during self-test. In this manner, the microcontroller 12 determines whether or not it is receiving an expected output from the energized relay driver. For example, the microcontroller can activate output 36 which in turn serves to activate the relay driver 20. When the relay driver 20 is activated, if functioning properly, there will be a corresponding input 45 signal at the single input of the microcontroller 12. If no such signal is received at the microcontroller 12, then it is known that there is a problem. For example, the relay driver 20 may be faulty or there may be incomplete traces on the board of the circuit, or other problems. The microcontroller 12 is also preferably adapted to display the results of the self-test on the display 16 of the user interface 14. Thus, self-test of a device 10 is provided using only a single input 45 to a microcontroller 12. No other microcontroller I/O lines are required. The microcontroller would only require minimal additional programming and likely no additional memory resources are required. Thus, the same microcontroller that serves a primary purpose such as controlling the device also serves the secondary purpose of providing self-test functions.

Figure 4:
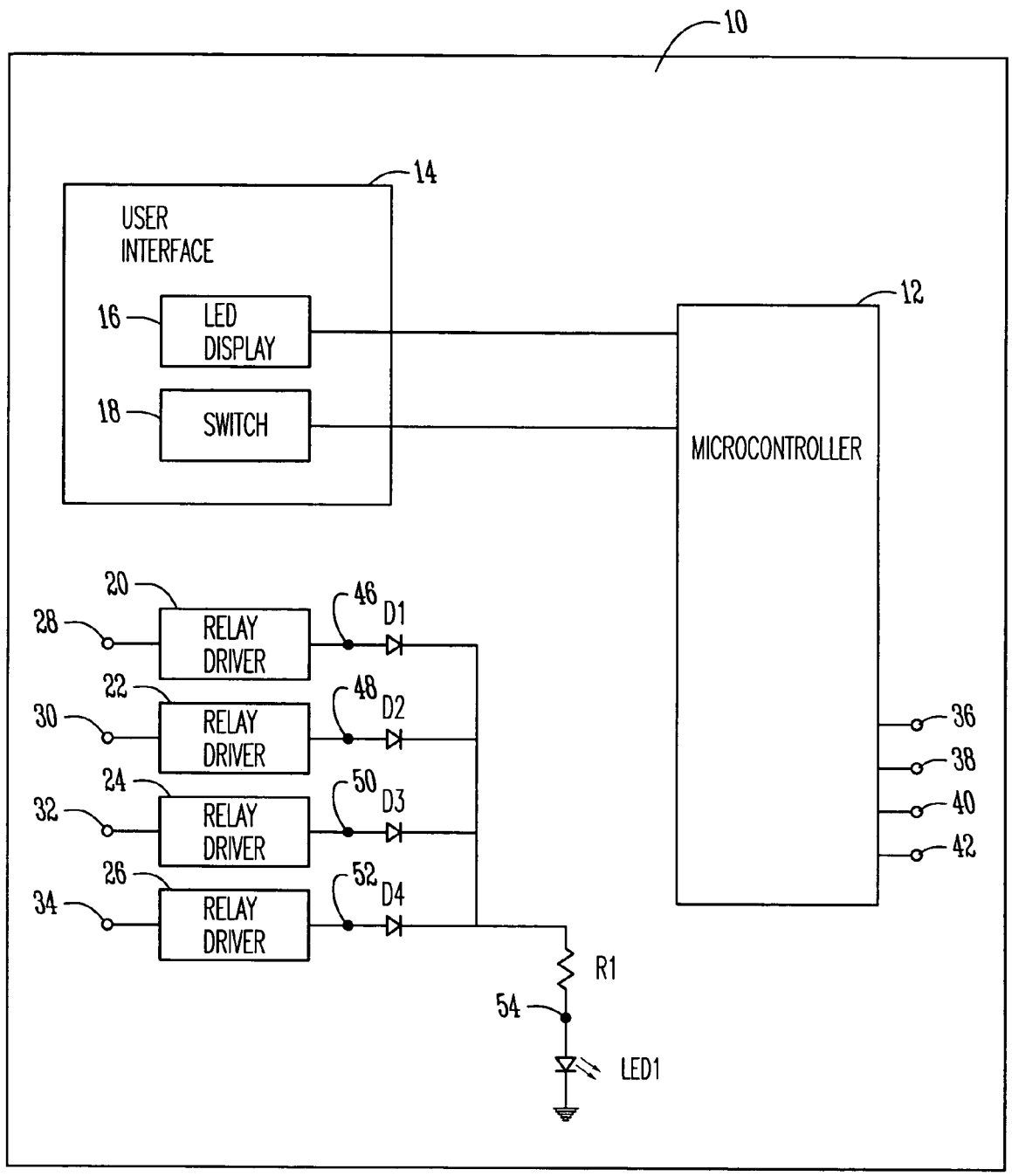
FIG. 4 is a diagram illustrating a self-testing apparatus where a microcontroller is used in self-testing and no input to the microcontroller is required.

FIG. 4 illustrates another embodiment of a self-test circuit of the present invention. FIG. 4 uses the schematic illustrated in FIG. 2 but provides additional detail. The embodiment shown in FIG. 4 does not require the single input line to the microcontroller 12. Instead, each diode (D1, D2, D3, D4) is electrically connected through resistor R1 to the input of a light emitting diode (LED1). Therefore to monitor the self-test of this embodiment of the present invention, the light emitting diode (LED1) is observed. The microcontroller 12 is adapted to separately energize each of the relay drivers (20, 22, 24, 26). When functioning properly, each time the relay driver (20, 22, 24, 26) is energized, the light emitting diode (LED1) is lit. Therefore, the present invention provides for initiating self-test and then having an operator observe the number of times that the light emitting diode (LED1) is lit to determine whether or not the relay drivers (20, 22, 24, 26) are functioning as appropriate. If the light emitting diode (LED1) is not lit the appropriate number of times or at the appropriate time, then it is known that the built in self-test has indicated a failure and there is a problem with the control board of the device 10. Only a minimum of additional circuitry is used because the multiple relay drivers (20, 22, 24, 26) or other components being tested are all tied to a single input 54 to the light emitting diode (LED1).

In the self-test of FIG. 4, the microcontroller 12 is adapted for initiating self-test. The self-test can be initiated through the user interface 14. Thus, the microcontroller 12 is still a part of the self-test process, but the light emitting diode (LED1) is used instead of the user interface 14 to provide results of the self-test.

Figure 5:
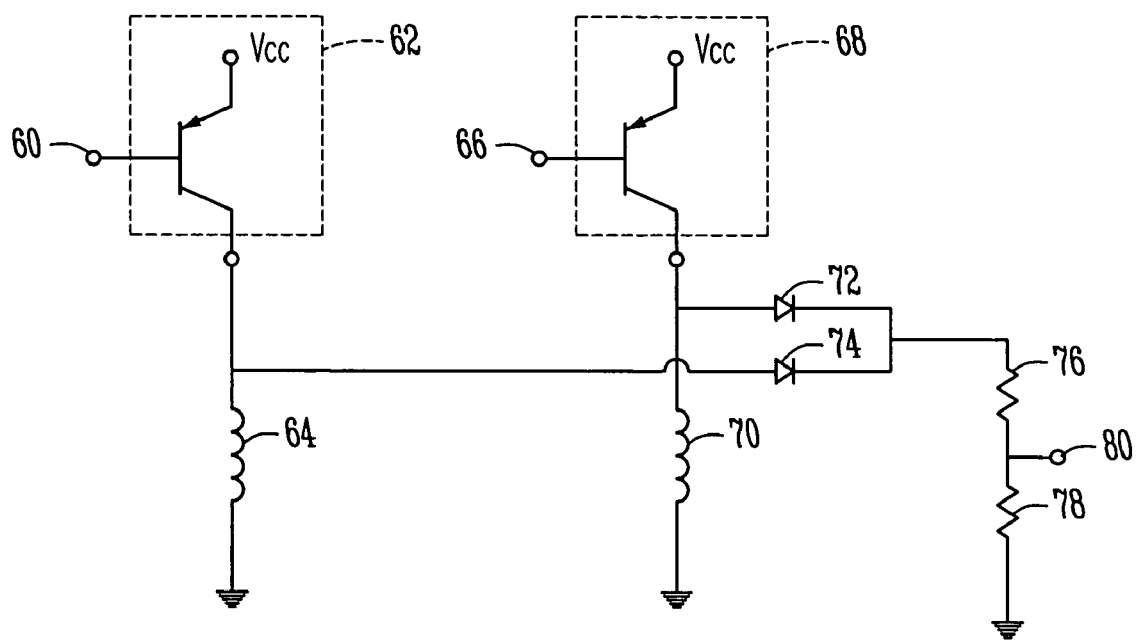
FIG. 5 is a diagram illustrating one embodiment of a high-side driver of the present invention.
Figure 6:
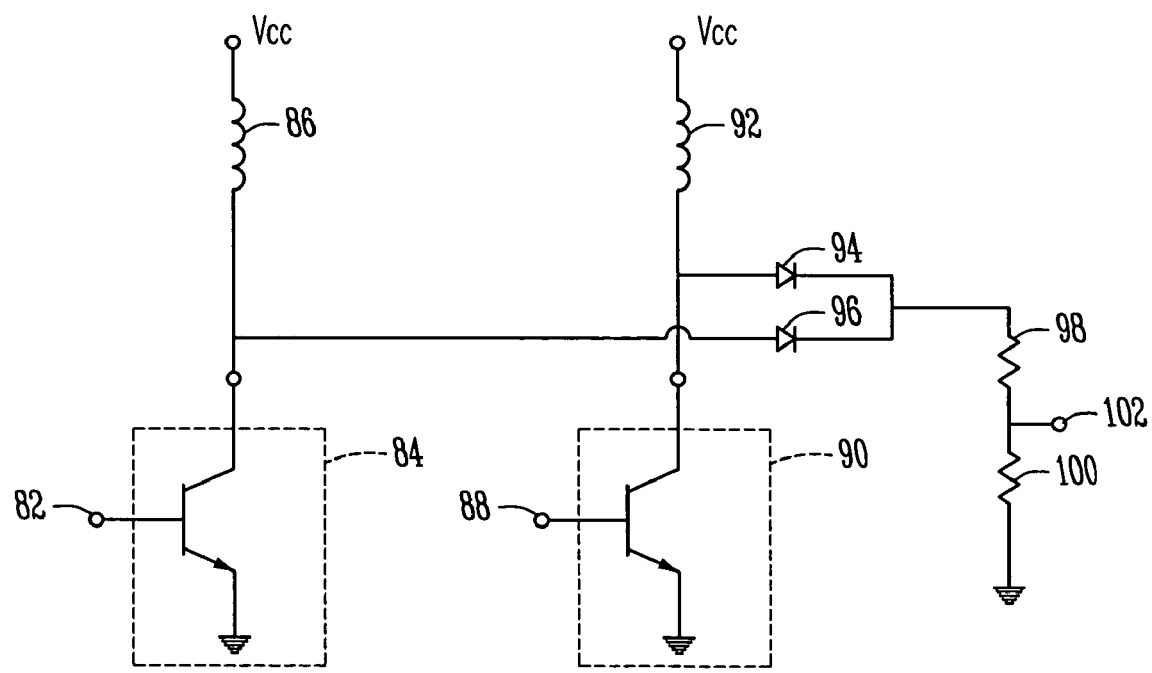
FIG. 6 is a diagram illustrating one embodiment of a low-side driver of the present invention.

FIGS. 5 and 6 provide additional embodiments of the present invention. FIG. 5 illustrates the use of high-side relay drivers while FIG. 6 illustrates the use of low-side relay drivers. In FIG. 5, inputs 60 and 66 to high-side relay drivers 62 and 68, are shown. Relay driver 62 drives relay coil 64 while relay driver 68 drives relay coil 70. Note that both relay coil 64 and relay coil 70 are electrically connected directly to ground at one terminal with the outputs tied to the relay drivers 62 and 68 respectively. Diodes 72 and 74 are electrically connected to resistor 76 which forms a voltage divider with resistor 78. A microcontroller input 80 is electrically connected at the output of the voltage divider.

FIG. 6 illustrates low-side relay driver 84 with an input 82 and low-side relay driver 90 with an input 88. One terminal of relay coil 86 is electrically connected to a supply voltage with the opposite terminal electrically connected to relay driver 84. Similarly, one terminal of relay coil 92 is electrically connected to a supply voltage with the opposite terminal electrically connected to the relay driver 90. Diodes 94 and 96 are electrically connected to resistor 98. Resistors 98 and 100 form a voltage divider with an output to a microcontroller input 102.

In the low-side relay driver embodiment of FIG. 6, in order to see a logical zero at the microcontroller input 102, all of the drivers (84, 90) must be energized simultaneously. Then each relay output is individually de-energized to provide a logical one to the microcontroller input 102. This approach of using a low-side relay driver (84, 90) results in increased functionality as the microcontroller tests the entire current loop for a particular coil (86, 92), rather than just test the output of the relay driver (84, 90). The low-side relay drivers shown in FIG. 6 can be used in various embodiments of the present invention, including where an LED is used instead of a microcontroller input.

A self-test circuit for use in any number of devices has been disclosed. The present invention contemplates numerous variations as may be appropriate when using a particular apparatus or as may be appropriate in a particular environment. For example, the present invention contemplates variations in the components being tested. The present invention is not to be limited to the specific embodiments disclosed herein, but to all variations within the spirit and scope of the claimed invention.

What is claimed is:

1. An apparatus adapted for self-test, comprising:
a microcontroller;
a plurality of relay driver outputs electrically connected to a voltage dividing circuit comprising a first resistor and a second resistor;
a single microcontroller input electrically connected to the voltage dividing circuit between the first resistor and the second resistor such that only the single microcontroller input is used to monitor operation of the plurality of relay drivers;
the microcontroller adapted to energize each of the plurality of relay driver outputs during self-test and further adapted for monitoring the single microcontroller input during self-test to determine if the relay driver outputs operate as expected.

2. The apparatus of claim 1 further comprising a plurality of diodes, each diode between one of the relay driver outputs and the voltage dividing circuit to provide isolation.

3. The apparatus of claim 1 further comprising a user interface operatively connected to the microcontroller.

4. The apparatus of claim 3 wherein the user interface includes a display and wherein the microcontroller is further adapted to display results of the self-test on the display.

5. The apparatus of claim 1 wherein the microcontroller is adapted to separately energize each of the plurality of relay outputs during the self-test.

6. The apparatus of claim 1 wherein the microcontroller is adapted to energize all of the plurality of relay driver outputs during self-test and further adapted to individually de-energize each of the plurality of relay driver outputs during self-test.

7. An apparatus adapted for a noninvasive self-test while only requiring only a single microcontroller input, comprising:
a microcontroller;
a plurality of relay driver outputs electrically connected to a voltage dividing circuit comprising at least a first resistor and at least a second resistor;
the single microcontroller input of the microcontroller electrically connected to a voltage dividing circuit such that only the single microcontroller input is used to monitor operation of the plurality of relay drivers;
a display electrically connected to the microcontroller, the display having a primary purpose and a secondary purpose, the secondary purpose being to provide feedback from the self-test;
the microcontroller adapted to energize the plurality of relay driver outputs during self-test and further adapted for monitoring the single microcontroller input during self-test and the controlling display of feedback from the self-test on the display.

8. The apparatus of claim 7 wherein the voltage dividing circuit comprises a first resistor and a second resistor and wherein the single microcontroller input is electrically connected between the first resistor and the second resistor.

9. The apparatus of claim 7 further comprising a plurality of diodes, each of the diodes between one of the relay driver outputs and the voltage dividing circuit to provide isolation.

10. The apparatus of claim 7 wherein the microcontroller is adapted to energize all of the plurality of relay driver outputs during self-test and further adapted to individually de-energize each of the plurality of relay driver outputs during self-test.

11. The apparatus of claim 7 wherein the microcontroller is adapted to separately energize each of the plurality of relay outputs during the self-test.

12. An apparatus adapted for self-test, comprising:
a microcontroller;
a plurality of relay drivers having outputs electrically connected to form a single input for self-test monitoring;
the microcontroller electrically connected to the plurality of relay drivers and adapted to energize each of the plurality of relay drivers during self-test.

13. The apparatus of claim 12 wherein the single input for self-test monitoring is a single microcontroller input.

14. The apparatus of claim 13 wherein the microcontroller is further adapted for monitoring the single microcontroller input to determine if the relay drivers operate as expected.

15. The apparatus of claim 12 further comprising a plurality of diodes, each of the diodes between one of the outputs of the relay drivers and the single input for the self-test monitoring, the plurality of diodes providing isolation.

16. The apparatus of claim 12 wherein the single input for the self-test monitoring is a light emitting diode input.

17. The apparatus of claim 16 wherein the microcontroller is adapted for energizing each of the plurality of relay drivers during self-test with sufficient delay between energizing such that a number of times the LED is lit during self-test is observable.

18. An apparatus adapted for self-test, comprising:
a microcontroller;
a plurality of relay driver outputs electrically connected to an LED:
the microcontroller adapted for energizing each of the plurality of relay driver outputs during self-test with sufficient delay between energizing such that a number of times the LED is lit is observable.

19. The apparatus of claim 18 further comprising a plurality of diodes, each of the diodes between one of the relay driver outputs and the LED.

20. The apparatus of claim 19 further comprising a resistor between the plurality of diodes and the LED.

21. The apparatus of claim 19 further comprising a user interface electrically connected to the microcontroller.

22. The apparatus of claim 21 wherein the microcontroller is further adapted to receive an input from the user interface to initiate the self-test.

23. An apparatus adapted for self-test, comprising:
a microcontroller;
a plurality of component outputs electrically connected to a voltage dividing circuit comprising a first resistor and a second resistor;
a single microcontroller input electrically connected to the voltage dividing circuit between the first resistor and the second resistor such that only the single microcontroller input is used to monitor operation of the plurality of components;
the microcontroller adapted to energize each of the plurality of component outputs during self-test and further adapted for monitoring the single microcontroller input during self-test to determine if the relay driver outputs operate as expected.

24. The apparatus of claim 23 further comprising a plurality of diodes, each diode between one of the component outputs and the voltage dividing circuit to provide isolation.

25. The apparatus of claim 23 further comprising a user interface operatively connected to the microcontroller.

26. The apparatus of claim 25 wherein the user interface includes a display and wherein the microcontroller is further adapted to display results of the self-test on the display.

27. The apparatus of claim 25 wherein the microcontroller is further adapted to simultaneously energize each of the plurality of components and subsequently and individually de-energize each of the plurality of component outputs to provide for testing an entire current loop for each relay driver.

* * * * *